United States Patent
Clevenger et al.

(10) Patent No.: US 6,348,395 B1
(45) Date of Patent: Feb. 19, 2002

(54) DIAMOND AS A POLISH-STOP LAYER FOR CHEMICAL-MECHANICAL PLANARIZATION IN A DAMASCENE PROCESS FLOW

(75) Inventors: Lawrence A. Clevenger, LaGrangeville; Louis L. C. Hsu, Fishkill; Jeremy K. Stephens, New Windsor; Michael Wise, Lagrangeville, all of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/589,818

(22) Filed: Jun. 7, 2000

(51) Int. Cl.$^7$ .............................................. H01L 21/76
(52) U.S. Cl. ...................... 438/424; 438/296; 438/589; 438/634
(58) Field of Search ................................ 438/296, 424, 438/429, 589, 634, 970

(56) References Cited

U.S. PATENT DOCUMENTS

| | | | |
|---|---|---|---|
| 4,702,792 A | | 10/1987 | Chow et al. |
| 5,246,884 A | * | 9/1993 | Jaso et al. ................... 437/225 |
| 5,654,232 A | | 8/1997 | Gardner |
| 5,783,476 A | * | 7/1998 | Arnold ......................... 438/425 |
| 5,786,262 A | * | 7/1998 | Jang et al. ................... 438/424 |
| 5,876,490 A | | 3/1999 | Ronay |
| 5,916,453 A | | 6/1999 | Beilin et al. |
| 5,926,722 A | * | 7/1999 | Jang et al. ................... 438/424 |
| 5,985,762 A | | 11/1999 | Geffken et al. |
| 6,016,000 A | | 1/2000 | Moslehi |
| 6,110,797 A | * | 8/2000 | Perry et al. .................. 438/424 |
| 6,124,198 A | * | 9/2000 | Moslehi ........................ 438/622 |
| 6,140,226 A | * | 10/2000 | Grill et al. ................... 438/637 |
| 6,187,651 B1 | * | 2/2001 | Oh .............................. 438/435 |
| 6,207,534 B1 | * | 3/2001 | Chan et al. ................... 438/427 |
| 6,214,699 B1 | * | 4/2001 | Joyner .......................... 438/445 |
| 6,291,334 B1 | * | 9/2001 | Somekh ........................ 438/620 |

FOREIGN PATENT DOCUMENTS

GB 2186424 * 8/1987

OTHER PUBLICATIONS

IBM Technical Disclosure Bulletin, Jun 1992 (19920601), IBM Corporation, vol. 35, issue No. 1B, page No. 211–213.*

* cited by examiner

Primary Examiner—John F. Niebling
Assistant Examiner—Angel Roman
(74) Attorney, Agent, or Firm—DeLio & Peterson, LLC; Kelly M. Reynolds; H. Daniel Schnurmann

(57) ABSTRACT

A method of using diamond or a diamond-like carbon layer as a polish-stop for patterning a metal level into an inter-level dielectric substrate using a damascene process flow. The diamond or diamond-like carbon layer is deposited onto the surface of the substrate before patterning the metal level. A protective layer is then deposited over the diamond or diamond-like carbon polish-stop layer, wherein such protective layer may act as an additional polish-stop layer. Together, the diamond or diamond-like carbon polish-stop layer and the protective layer are used as a hard-mask for patterning the trenches that will become the metal features, wherein such protective layer protects the diamond or diamond-like carbon polish-stop layer during the patterning process. After deposition of a conductive metal layer, the dielectric substrate is polished to remove excess conductive material, as well as topography. In the polishing process, the diamond or diamond-like carbon polish-stop layer and any remaining protective layer are used as polish-stop layers. The diamond or diamond-like carbon polish-stop layer allows for an improved planar surface, thereby resulting in a sufficient decrease in topography at the surface of the inter-level dielectric.

29 Claims, 4 Drawing Sheets

DIAMOND AS A POLISH-STOP LAYER FOR CHEMICAL-MECHANICAL PLANARIZATION IN A DAMASCENE PROCESS FLOW

BACKGROUND OF THE INVENTION

1. Field of the Invention

The present invention relates to planarizing semiconductor devices in a Damascene process, and more particularly, to methods of planarizing a variety of surfaces of semiconductor devices by using first a diamond or a diamond-like carbon layer as a polish-stop layer, and then protecting such diamond-like carbon layer with a hard-mask, wherein such hard-mask may act as an additional polish-stop layer, thereafter chemically-mechanically polishing the surface of such semiconductor thereby producing an improved planarized surface.

2. Description of Related Art

Semiconductor devices can be patterned by a variety of methods, as disclosed in the prior art. A Damascene process flow is one such technique. Typically, a Damascene process comprises depositing an insulator material onto the surface of a substrate, patterning the insulator material to form openings for wires and vias, depositing a conductive material, generally a metal, into such openings and subsequently removing excess conductive material. Damascene processes may be used to form a variety of semiconductor surfaces, such as planarized multi-level metal interconnect structures, planarized shallow trench isolation structures, planarized semiconductor islands, and the like.

In patterning a semiconductor in a Damascene process, a substrate may be coated with a polymeric radiation-sensitive layer, known in the art as a resist layer. The resist layer is then developed. One such technique of developing a resist is to react the irradiated resist with an organometallic reagent and then subsequently expose the resist layer to an etchant, such as an oxygen plasma. Such an etchant removes the less etch-resistant, non-irradiated portions of the resist layer, thus layers applied to the substrate in a Damascene process, which are to be retained, must be resistant to such an etchant.

After formation of the patterned resist layer, the resist patterns are transferred into the substrate by an etch process. A conductive layer is then applied over the surface of the substrate, so that the conductive material fills the openings of the patterned substrate, contacting the device beneath. During the process of forming interconnect structures by a Damascene process, excess conductive material may accumulate at the surface of the semiconductor. Such excess conductive material may be removed by techniques such as chemical-mechanical polishing, thereby forming a substantially planar surface of the semiconductor device.

The use of chemical-mechanical polishing (CMP) processes to form flat planar surfaces of a semiconductor in a Damascene process are well established in the field. CMP processes enhance removal of non-planar regions of a surface by chemically reacting portions of the surface while mechanically applying force, thereby permitting a high degree of accuracy in the uniformity of polished semiconductor flatness. In a CMP process, it is desirable to consistently stop processing of a surface at a desired endpoint, thereby producing such a planar surface of the semiconductor. The use of polish-stop layers are well known in the art to stop a CMP process at such a desired endpoint. The prior art discloses a variety of methods of determining such endpoints. Generally, prior art discloses stopping polishing of a substrate at a desired endpoint in a CMP process by using techniques including, for example, copper as a polish-stop layer, time-to-polish stop layers, measuring thickness of the substrate, heat measurement stop-layers, and the like. However, the use of such polish-stop layers must be closely monitored otherwise over-polishing may occur, resulting in additional topography of the surface of the semiconductor.

CMP polish-stop layers are known in the art for use in global depositions processes, as well as in patterning a metal layer into an inter-level. As disclosed in the prior art, the use of polish-stop layers in Damascene processes may involve depositing a polish-stop layer over a planarized surface of the semiconductor and subsequently performing a CMP process. The CMP process in a Damascene process ends or stops at the polish-stop layer. Such disclosures teach the polish-stop layer may be deposited globally to the surface of the semiconductor or applied to fill apertures or openings in such surface.

In addition to global depositions in Damascene processes, polish-stop layers may be used in patterning a metal layer into an inter-level dielectric. In patterning a metal layer into an inter-level dielectric during a Damascene process flow, removal of the dielectric layer during a chemical-mechanical over-polish may create sufficient topography. This topography can consist of metal and dielectric surfaces that are at different heights, or can consist of dishing of both the metal and dielectric layers over relatively large areas. Thus a need exists to create an improved method of planarizing a substrate surface using a polish-stop layer with the ability to over-polish and create a substantially planarized surface.

The use of global disposition of diamond or a diamond-like carbon material as a polish-stop layer in a CMP process has been disclosed in U. S. Pat. No. 5,246,884 to Jaso et al, assigned to the present assignee. Jaso teaches the use of diamond or a diamond-like carbon material as a polish etch stop without patterning the semiconductor. However, no known art reports the use of diamond or a diamond-like carbon material as a polish-stop layer in patterning a metal layer into an inter-level dielectric in a Damascene process. The use of diamond or a diamond-like carbon material as disclosed in Jaso would not be effective as a polish-stop layer in a patterning step of a Damascene process, primarily due to the volatility of diamond or a diamond-like carbon material during such patterning step.

The present invention provides a method of patterning a metal layer into a multi-level dielectric in a Damascene process flow which significantly decreases the amount of topography created by the removal of the dielectric during the chemical-mechanical over-polish, wherein such method may be used to form a variety of semiconductor surfaces.

Bearing in mind the problems and deficiencies of the prior art, it is therefore an object of the present invention to provide a method of forming a variety of planarized semiconductor surfaces in a Damascene process wherein there is a significant reduction in topography.

Another object of the present invention is to provide a method of reducing topography in the formation of a multi-level metal interconnect structure.

It is another object of the present invention to provide a method of reducing topography in the formation of a planarized semiconductor island.

A further object of the invention is to provide a method of reducing topography in the formation of a planarized shallow trench isolation structure.

It is another object of the present invention to provide a semiconductor structure having a polish-stop layer material wherein the thermal conductivity of the finished semiconductor chip is greatly improved.

Another object of the present invention is to provide a method of forming a planarized semiconductor with an improved ability to over-polish during the CMP process without creating additional topography.

It is another object of the present invention to provide a decrease in the amount of monitoring and control required for the processing of the chemical-mechanical polishing.

Still other objects and advantages of the invention will in part be obvious and will in part be apparent from the specification.

SUMMARY OF THE INVENTION

The above and other objects and advantages, which will be apparent to one of skill in the art, are achieved in the present invention which is directed to, in a first aspect, method of planarizing a surface of a semiconductor in a Damascene process flow using diamond or a diamond-like material as a polish-stop layer comprising: optionally depositing a dielectric or conductive layer on the surface of a semiconductor, depositing a diamond or diamond-like layer on top of such dielectric or conductive layer, depositing a hard-mask layer which serves to protect the diamond or diamond-like layer during a patterning process, forming a plurality of openings, forming a metal layer, and then planarizing the surface of the semiconductor to form a substantially planarized surface.

In a preferred embodiment of the present invention discloses a method of planarizing a semiconductor by forming a first diamond-like carbon polish stop layer on a surface of a substrate, forming a second hard-mask layer on the surface of said first polish stop layer, wherein in addition to such second layer being a hard-mask, it further comprises a second polish stop layer, patterning the second layer to form a first set of openings, patterning an exposed portion of the first layer to form a second set of openings, and then patterning an exposed portion of the substrate to form a third set of openings. Thereafter, a third layer is formed on the surface of the substrate therein at least filling the third set of openings and subsequently the substrate surface is planarized to remove at least any excess of the third layer. The planarization may at least stop at the second hard-mask polish-stop to achieve an overall substantial planarity, or may continue to the diamond or diamond-like polish stop layer. The diamond or diamond-like polish stop layer allows for an over-polishing process while still maintaining a substantially planar surface of the substrate.

In a further aspect, the present invention describes a method of forming a planarized interconnect semiconductor structure in a Damascene process according to the method above.

In a further aspect, the present invention describes a method of forming a planarized semiconductor isolation structure in a Damascene process according to the method above.

In a further aspect, the present invention describes a method of forming a planarized semiconductor island structure in a Damascene process according to the method above.

Still another aspect of the invention is the disclosure of a semiconductor having a substantially planar surface formed by the method as described above.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENT(S)

Figure 1A:
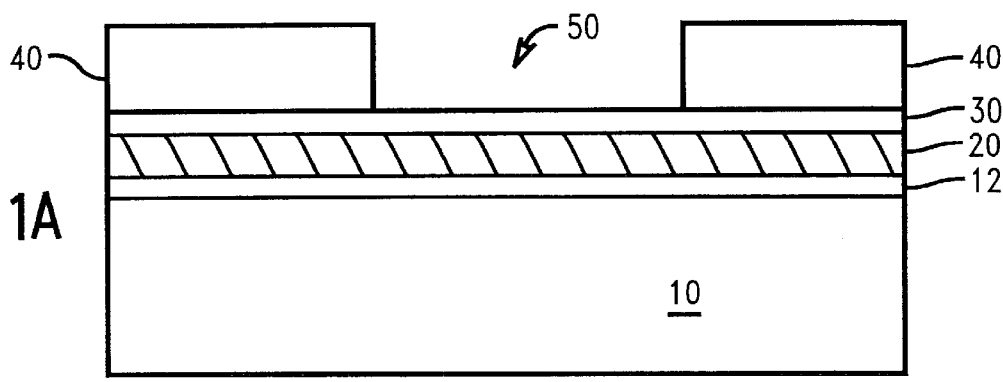
FIGS. 1A–1F are elevational cross-sectional views of a semiconductor substrate wherein an interconnect semiconductor structure is formed in accordance with a preferred embodiment of the present invention.

In describing the preferred embodiment of the present invention, reference will be made herein to FIGS. 1A–3D of the drawings in which like numerals refer to like features of the invention. Features of the invention are not necessarily shown to scale in the drawings. Numerous embodiments of the present invention are possible, including the embodiments described below.

The present invention discloses the use of diamond or a diamond-like material as a polish-stop layer to pattern and create a semiconductor surface in a Damascene process flow. The present invention may be used to create a variety of planarized semiconductor structures, such as multi-level metal interconnect structures, a semiconductor islands, and shallow trench isolation structures, for example. Generally, the present invention discloses a planarized semiconductor as well as a method of forming the same in a Damascene. Such method comprises optionally depositing a dielectric or conductive layer on the surface of a semiconductor, depositing a diamond or diamond-like layer on top of such dielectric or conductive layer, depositing a hard-mask layer which serves to protect the diamond or diamond-like layer during a patterning process, forming a plurality of openings, forming a metal layer, and then planarizing the surface of the semiconductor to form a substantially planarized surface.

One of the preferred embodiments of the present invention is illustrated in FIGS. 1A through 1E. FIGS. 1A through 1E illustrate the steps of forming a planarized metal interconnect structure on a surface of a semiconductor or insulator structure using diamond, or a diamond-like carbon material, as the polish stop-layer in the polish step of a Damascene process flow, wherein, a diamond-like carbon material is defined as diamond, graphite, amorphous carbon, silicon carbide, and the like, and combinations thereof.

FIG. 1A illustrates the steps of providing a thin dielectric layer, depositing a first, polish-stop layer comprising diamond, or diamond-like carbon material on a surface of a semiconductor or insulator structure, coating such first polish-stop layer with an etch stop layer, and then patterning such protective layer, thereby patterning the underlying first polish-stop layer. A thin dielectric layer 12 is deposited onto a surface of a substrate 10. Such dielectric layer 12 can be a thin high-quality oxide, for example, a thermal oxide grown on silicon surface. Dielectric layer 12 improves the adhesion of the first polish-stop layer to the substrate 10. It also ensures the interface quality on the semiconductor surface. Substrate 10 may be a semiconductor or insulator structure comprising, for example, doped or undoped glass, quartz, ceramic, or any high resistive semiconductor material.

In the step of forming the first polish-stop layer, as illustrated in FIG. 1A, a diamond or diamond-like carbon material, preferably diamond, is deposited on such thin dielectric layer 12 to form a first polish-stop layer comprising a first, diamond polish-stop layer 20. The first, diamond polish-stop material may be deposited by techniques currently in use and well established in the industry including, for example, conformal coating techniques such as chemical vapor deposition (CVD), evaporation, and sputtering. In a preferred embodiment, the diamond polish-stop material is deposited in a thickness ranging from about 5 nm to about 1000 nm. Preferably, the diamond polish-stop material is deposited in a CVD reactor in a thickness of about 200 nm.

FIG. 1A, further illustrates the formation of a hard-mask layer which acts as a combined protective layer and second polish-stop layer. Such protective layer comprises depositing a material on top of the first, diamond polish-stop layer 20 to form hard-mask layer 30. Such hard-mask layer 30 serves as a hard-mask for the first, diamond polish-stop layer 20, protecting the same from eroding, corroding, degrading, and the like, during a patterning process. Furthermore, hard-mask layer 30 may serve as a second polish-stop layer. In doing so, hard-mask layer 30 may remain on the substrate 30 after the same has been patterned and etched, thereby acting as a polish-stop layer during polishing, such as a CMP process. Hard-mask layer 30 may consist of a variety of materials, such as nitride, oxide, oxynitride, and the like, and combinations thereof. It may also be deposited by the above described techniques in use and established in the industry. For example, hard-mask layer 30 may be deposited in a thickness ranging from about 10 nm to about 1000 nm. Preferably, the hard-mask layer 30 comprises nitride, and is deposited in a CVD reactor in a thickness of about 100 nm.

The next step comprises patterning the hard-mask layer 30, preferably by a photo-resist process. Hard-mask layer 30 masks the diamond polish-stop layer 20 during the photo-resist process, thereby protecting the same. FIG. 1A illustrates a photo-resist layer 40 being applied to hard-mask layer 30. Photo-resist layer 40 is deposited on top of hard-mask layer 30. The photo-resist layer 40 preferably comprises a photo sensitive material and is deposited by a technique such as one known in the art. In a preferred embodiment of the present invention, photo-resist layer 40 comprises a combination of a resin, sensitizer, and solvent, wherein such photo-resist layer 40 is deposited in a thickness ranging from about 0.5 $\mu$m to about 2 $\mu$m. The photo-resist layer 40 is then patterned and developed, for example, by first exposing the resist to a radiation using a mask, then developing the photo-resist by using an aqueous base thereby creating an opening or cavity 50. Cavity 50 consists of a bottom portion and two side-walls. The bottom portion of cavity 50 exposes the hard-mask layer 30 and the two side-walls expose edges of the patterned photo-resist layer 40.

Figure 1B:
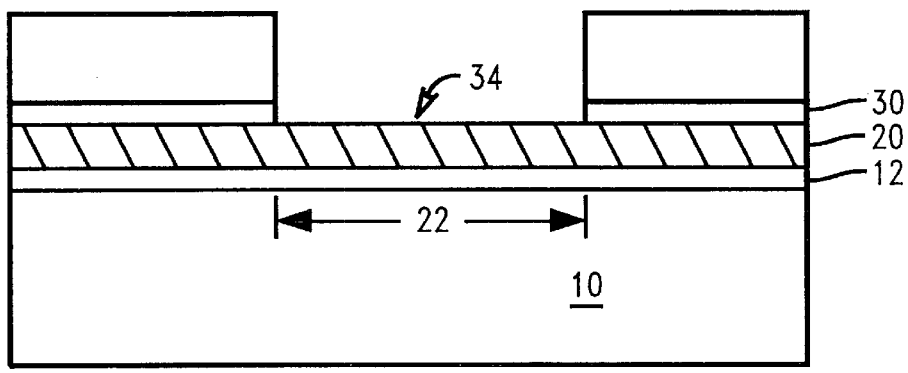

The exposed hard-mask layer 30 is then subjected to a first etch process. FIG. 1B illustrates the hard-mask layer 30 after the same has undergone such a first etch process, thereby create opening 34 in the hard-mask layer 30. Hard-mask layer 30 is subjected to etch techniques currently in use and well established in the industry. In a preferred embodiment, the hard-mask layer 30 is etched in a reactive ion etch reactor in a fluorine based plasma, such as a dry tech process with a $CF_4$ plasma with an etch selectivity of 20:1 to both the photo-resist layer 40 and the underlying diamond material.

Thereby, the first etch process removes only the exposed hard-mask layer 30 and stops at the surface of the first, diamond polish-stop layer 20, creating opening 34 of hard-mask layer 30 and exposing a portion of the first, diamond polish-stop layer 20. FIG. 1B illustrates that a portion of a patterned photo-resist layer 40 and an underlying portion of the hard-mask layer 30 may remain on the surface of substrate 10 after the first etch process.

Figure 1C:
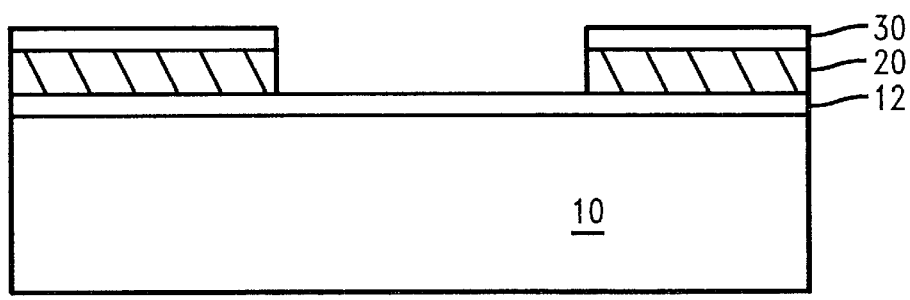

FIG. 1C illustrates the step of a second etch process. Such second etch process etches the exposed portion 22 of the diamond polish-stop layer 20. In FIG. 1C, the diamond polish-stop layer 20 is etched to remove portion 22 of the diamond polish-stop layer, thereby exposing an underlying portion of the substrate 10. The etching of such diamond polish-stop layer 20 may be performed by techniques used and well known in the art. Preferably, the etching of the diamond polish-stop layer 20 is performed in a reactive ion etch reactor in an oxygen based plasma, such as an $O_2$ plasma. In an $O_2$ plasma, the reactive oxygen is sufficient to damage the diamond layer, thereby degrading and/or eroding the same. Thus the hard-mask layer may be used to cover the diamond layer, thereby protecting such diamond layer from the $O_2$ plasma. The second etch process furthermore encompasses simultaneously removing a remaining portion of the photo-resist layer 40 as illustrated in FIG. 1C. In a preferred embodiment, photo-resist layer 40 is removed after hard-mask layer 30 has been patterned.

Figure 1D:
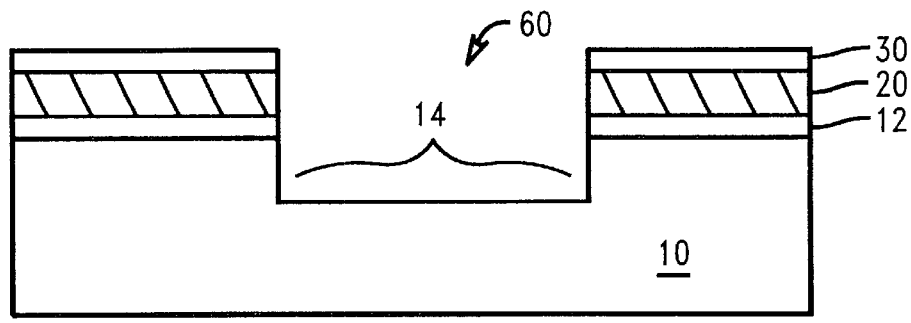

The next step comprises a third etch process. Such third etch forms an opening 60 in substrate 10, as illustrated in FIG. 1D. After the portion 22 of the diamond A polish-stop layer 20 has been removed, the exposed portion of the substrate 10 is then etched to form opening 60 of substrate 10. In the third etch process, the remaining hard-mask layer 30 and diamond polish-stop layer 20 act as a composite mask to etch the exposed substrate 10. In a preferred embodiment, such third etch is carried out in a reactive ion etch reactor in a fluorine-based or chlorine-based plasma, such as in a $CF_4$ or $Cl_2$ plasma, with an etch selectively of insulator or semiconductor substrate to the diamond mask greater than 10:1. The depth of opening 60 preferably ranges from about 100 nm to about 1000 nm. In such third etch process, the etch depth is controlled by etch time. Furthermore, depending on the type of substrate material, the hard-mask layer 30 may or may not stay after such third etch process.

Figure 1E:
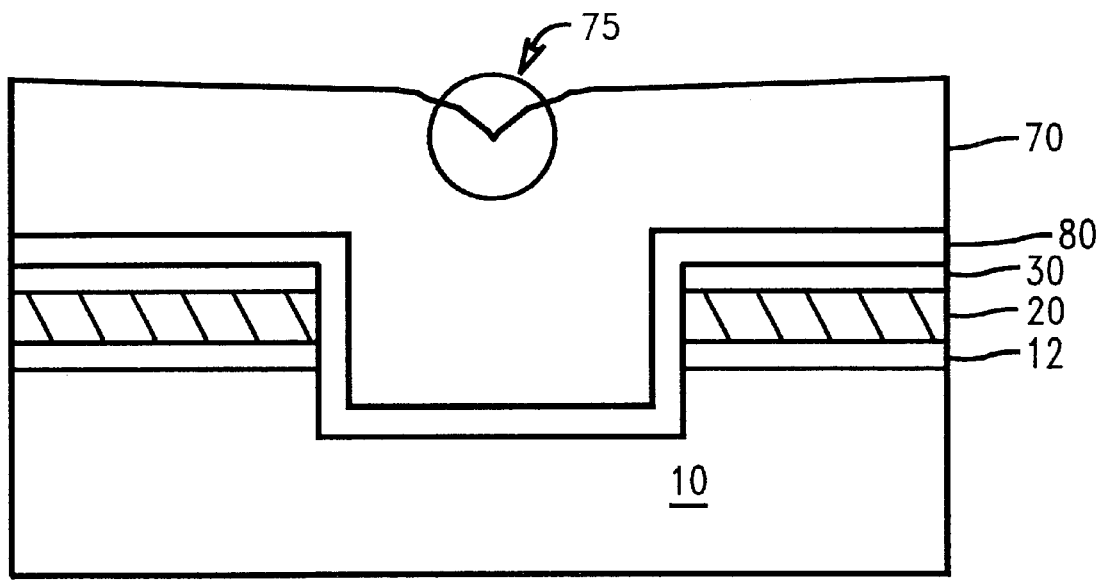
Figure 1F:
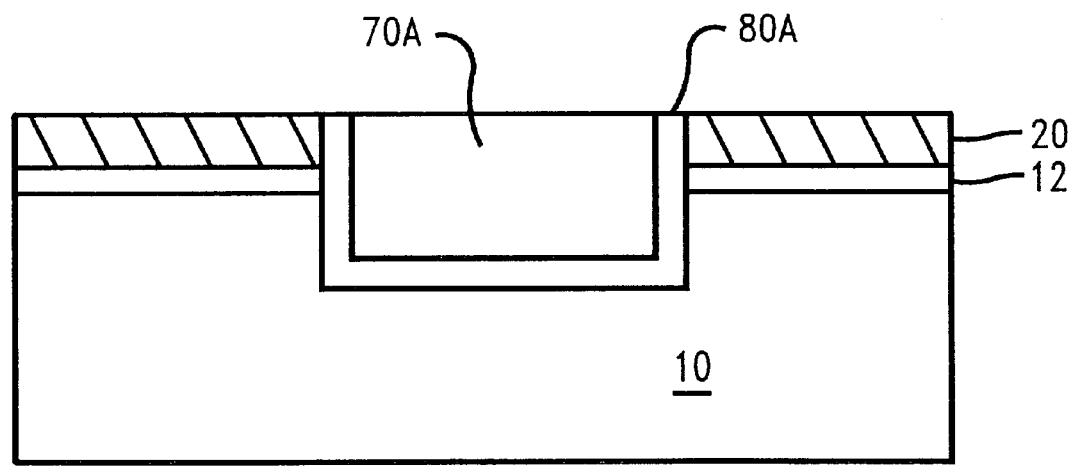

FIG. 1E. illustrates applying an adhesion layer over the surface of the substrate and then depositing a conductive layer. An adhesion promotion liner 80 is deposited over the surface of substrate 10 to promote adhesion of the conductive layer. Such adhesion promotion liner 80 may be a thin layer of Ti, TiN, Ta, TaN, Pd, W, or the like, for example, with a thickness ranging from about 5 nm to about 100 nm. Preferably, adhesion promotion liner 80 comprises TiN deposited in a thickness of about 20 nm. In an alternative embodiment, any remaining hard-mask layer 30 may be removed before depositing the adhesion promotion liner 80.

FIG. 1E further illustrates a conductive material being deposited onto the surface of substrate 10 in a thickness sufficient to fill opening 60. Such conductive material forms conductive layer 70. Conductive layer 70 may comprise, for example, a metal such as tetraethoxysilane (TEOS), doped glass, polyimide, polymer, Al, Cu, W, or any proper metal alloy, and combinations thereof. Such materials may be deposited by techniques in use and established in the industry. In a preferred embodiment, conductive layer 70 comprises, for example, doped polysilicon, tungsten, aluminum, copper, and the like, and is deposited in a CVD reactor in a thickness ranging from about 100 nm to about 2000 nm. In the step of depositing the conductive material, an excess of such conductive material may form on the surface of substrate 10. Furthermore, deposition of conductive layer 70 may create topography on the surface of the substrate, as indicated by 75. As a result, any excess conductive material or topography may be removed by a polishing technique, such as a CMP process.

The excess conductive material may be removed by a CMP process, such as those used and known in the art. In the CMP process, conductive layer 70 is polished to remove excess material on the surface of substrate 10. The CMP process stops at the diamond polish-stop layer 20, thereby creating a flat, planarized surface of the semiconductor. Both hard-mask layer 30 and diamond polish-stop layer 20 act as stopping mechanisms to create a metal interconnect on the semiconductor substrate. The resulting planarized semiconductor surface, as illustrated in FIG. 1E, comprises a pair of diamond polish-stop layer 20 portions, and therebetween a conductive layer 70 portion.

In a preferred embodiment, a chemical-mechanical polish process removes the excessive metal material using a silica based slurry, such as an acidic $Al_2O_3$ slurry including an oxidizer. Examples of appropriate oxidizers comprise ferric nitrate, hydrogen peroxide, iodates, and combinations thereof. The slurry pH is typically controlled with nitric acid. Over-polish may be necessary to ensure that the conductive layer 70 and the adhesion layer 80 at the semiconductor surface is completely removed. As the result of the over-polish, conductive layer 70 and adhesion layer 80 are now inside the cavity 50 as indicated by 70A and 80A, respectively. The protective layer 70 is polished away, and diamond polish-stop layer 20 prevents any topography due to over-polish effect. In the present invention, the chemical-mechanical polish metal to diamond or diamond-like material selectivity can reach above 2000:1, whereas the chemical-mechanical polish metal to $SiO_2$ selectively, as disclosed in the prior art, are typically about 10:1.

A second embodiment of the present invention is illustrated in FIGS. 2A through 2D. FIGS. 2A through 2D illustrate the steps of forming semiconductor islands on a semiconductor substrate in a Damascene process.

As illustrated in FIGS. 2A–2D, the formation of a semiconductor island on a semiconductor substrate in a Damascene process comprises the following above same steps:

applying a dielectric layer 160 on top of a substrate 100; depositing a diamond or diamond-like polish-stop layer 120, with a preferable thickness of about 200 nm; applying a protective layer 130 over the diamond polish-stop layer 120; and then depositing a photo-resist layer 140, with a preferred thickness of about 1 μm. In the formation of a semiconductor islands, the dielectric layer 160 may be silicon dioxide, nitride, oxynitride, doped or undoped glass, quartz, and the like, and combinations thereof, applied in a thickness of about 400 nm. Furthermore, as described above, the photo-resistor layer is then patterned. Such photo-resist layer 140 is patterned by first exposing the resist to a radiation using a mask, then developing the photo-resist by using an aqueous base to create an opening pattern 150. As above, a first etch process, such as a $CF_4$ plasma, then etches the exposed protective layer 130 with an etch selectivity of 20:1 to both photo-resist and the underlying diamond material.

Figure 2A:
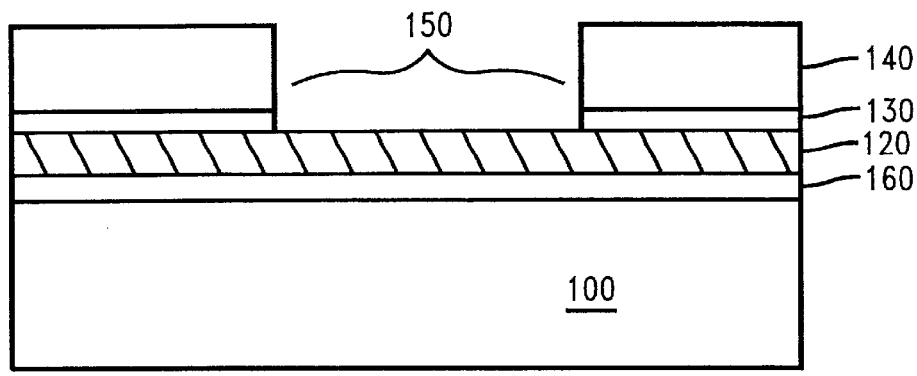
FIGS. 2A–2D are elevational cross-sectional views of a semiconductor substrate wherein a semiconductor island structure is formed in accordance with a preferred embodiment of the present invention.
Figure 2B:
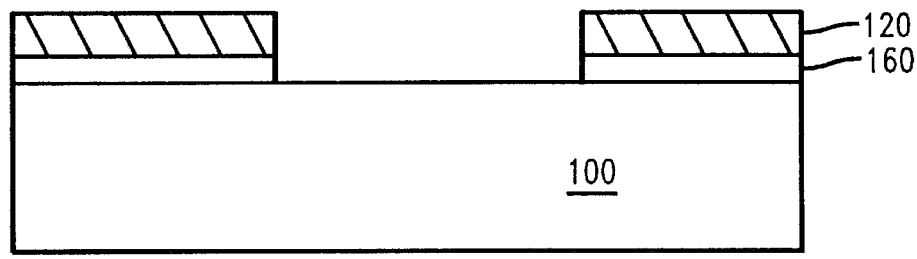
Figure 2C:
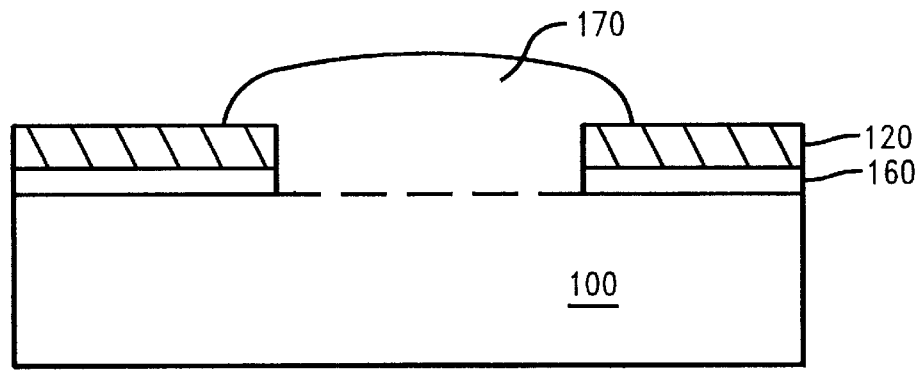

After the first etch process, a second etch process is performed. Such second dry etch may comprise an $O_2$ plasma, thereby exposing an underlying diamond layer 120 while simultaneously removing the remaining photo-resist layer 140. Next, as above, the composite protective layer 130 and diamond polish-stop layer 120 are used as a mask to etch the exposed dielectric layer 160, preferably in a $CF_4$ plasma with an etch selectivity of dielectric to the diamond mask greater than 10:1. Such protective layer 130 masks and protects the diamond polish-stop layer during the second etch process. In the second etch process, an overetch process may be performed to ensure that all the dielectric layer is completely removed, at the same time removing any remaining protective layer 130. FIG. 2B.

Figure 2D:
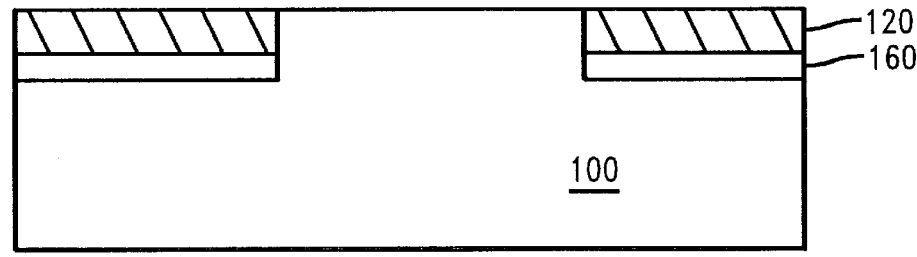

The second embodiment differs from the first in that an epitaxial growth process is performed in order to grow conductive layer 170 from the material comprising substrate 110, rather than applying a conductive material to form such conductive layer. In a preferred embodiment, an epitaxial growth process is carried out to grow semiconductor material from the substrate upward and over the diamond mask layer as shown in FIG. 2D. Such epitaxial growth may be performed by techniques known and used in the art. Such an epitaxial growth process forms excess substrate material at the surface of the semiconductor, as well as topography. A CMP process may be used to remove such excess and topography.

In the second embodiment, a chemical-mechanical polish process is carried out to remove the excessive semiconductor material using a basic $SiO_2$ slurry. The pH of the slurry can be controlled with ammonium hydroxide, potassium hydroxide, and the like, and combinations thereof. Over-polish is necessary to ensure that the semiconductor material 170 at the surface is completely removed and the surface is planarized. As a result of the over-polish, the semiconductor material now stays only inside the cavity area 150. The diamond or diamond-like polish stop layer prevents any topography due to over-polish effect. Chemical-mechanical polish semiconductor diamond-like material selectivity can exceed 2000:1.

In yet another preferred embodiment, a shallow trench isolation may be formed utilizing a method of the present invention. Shown in FIGS. 3A–3D, a layer of photo-resist layer 240 having a thickness of about 1 μm is applied over a semiconductor-on-insulator (SOI) substrate comprising a nitride layer 230 having a thickness of about 100 nm, a diamond or diamond-like material 220 having a thickness of about 200 nm, and a thin dielectric layer 270 having a thickness of about 20 nm disposed over semiconductive layer 260 on a substrate 200. Dielectric layer 270 is preferably thermal oxide which can act as an adhesion enhancement between diamond-like layer 220 and semiconductive layer 260. Semiconductive layer 260 may be doped or undoped silicon, SiGe, or any like compound.

Figure 3A:
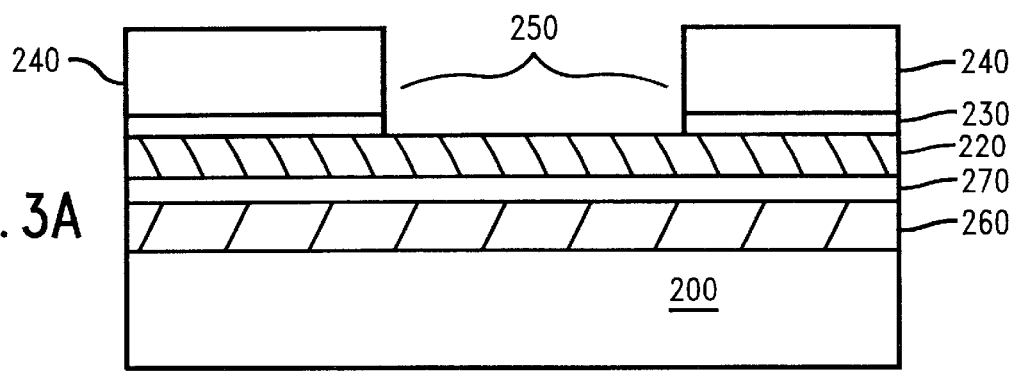
FIGS. 3A–3D are elevational cross-sectional views of a semiconductor substrate wherein a semiconductor isolation structure is formed in accordance with a preferred embodiment of the present invention.
Figure 3B:
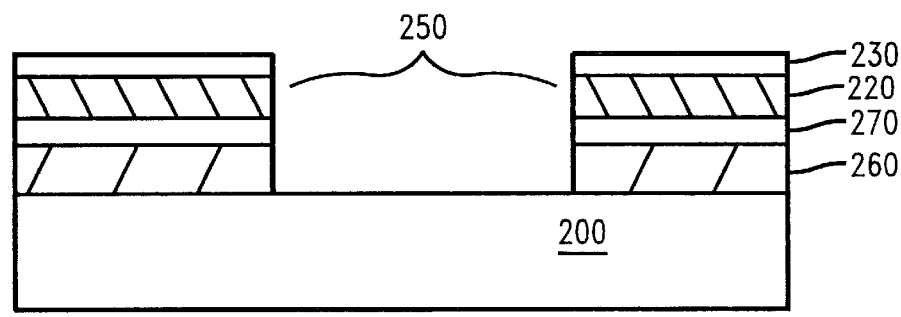

Photo-resist layer 240 is patterned by first exposing the resist to a radiation source using a photo-mask (not shown), and developing the photo-resist by using an aqueous base to create pattern 250. A dry etch process such as a $CF_4$ plasma under conditions known to one of skill in the art is used to etch the exposed nitride layer 230 in pattern 250 having an etch selectivity of about 20:1 to both the photo-resist and the underlying diamond-like material. After etching nitride layer 230, the resultant structure is shown in FIG. 3A.

Figure 3C:
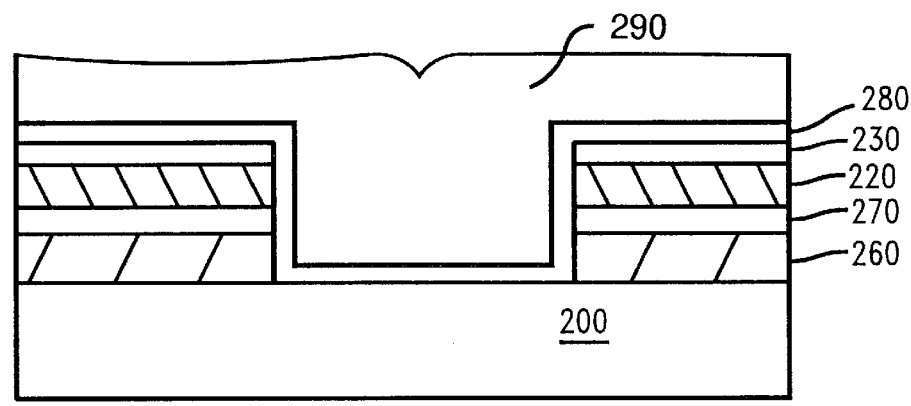

A second dry etch process with an $O_2$ plasma utilizing conditions known to one of skill in the art etches the exposed underlying diamond-like layer 220 and simultaneously remove any remaining photo-resist layer 240. Next, nitride layer 230 and diamond-like layer 220 is used as a composite mask to etch the exposed dielectric layer 270 with a $CF_4$ plasma using conditions known to one of skill in the art with an etch selectivity of the dielectric to the composite mask being greater than about 10:1. Overetching is carried out to ensure that substantially all of dielectric layer 270 in pattern 250 is completely removed. At the same time nitride layer 230 is also eroded during the etch but to within acceptable process parameters. After dielectric layer 270 is etched, a $Cl_2$ plasma using conditions known to one of skill in the art etches away the exposed semiconductor layer 260, and the resultant structure is shown in FIG. 3C.

A CVD dielectric deposition is carried out to deposit two layers of dielectric material. A preferred first dielectric material can be CVD oxide 280 that has a good interface quality to the semiconductor material, and a preferred second dielectric material 290 can be a low dielectric constant (low k) material, e.g., tetraethoxysilane (TEOS), to fill the cavity as shown in FIG. 3C. Alternatively, a thermal oxide may be grown on the exposed semiconductive layer 260, if semiconductor layer 260 comprises silicon. The thermal oxide has a high material interface quality which advantageously suppresses any leakage due to the presence of defects or dislocations when devices are built close to these interfaces.

Figure 3D:
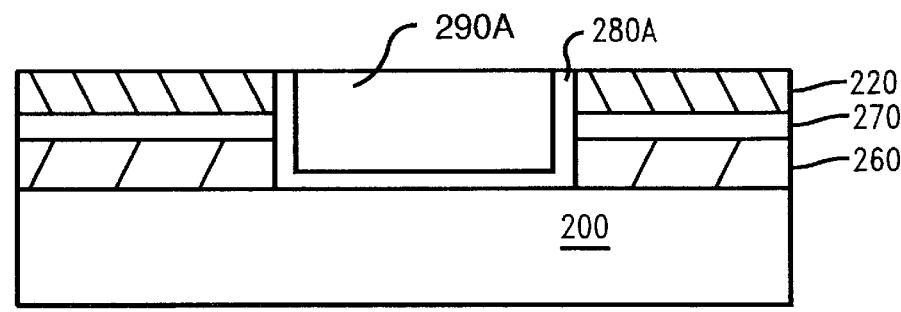

A chemical-mechanical polish process is carried out to remove the excessive dielectric material using $SiO_2$ or $CeO_2$ slurry. Typically, a $SiO_2$ slurry contains ammonium hydroxide or potassium hydroxide in order to maintain a basic pH of about 7 pH to about 12 pH. $CeO_2$ slurries may be used at widely varying pHs, preferably with polyelectrolytes as disclosed in U.S. Pat. No. 5,876,490 herein incorporated by reference. Overpolishing is favored to ensure that dielectric material 290 at the surface is substantially removed and the surface planarized. As the result of the overpolishing, the low k material 290A and the liner layer 280A have substantially filled pattern 250 as shown in FIG. 3D. Diamond-like polish stop layer 220 prevents any adverse topography caused by the overpolishing. The $SiO_2$ diamond-like polish stop material has a selectivity ranging from about 19:1 to about 311:1; the selectivity being significantly higher when the dielectric material is a low k material rather than $SiO_2$.

The present invention achieves the objects recited above. Diamond or a diamond-like material is used as a polish-stop layer to pattern and create a semiconductor surface in a Damascene process flow. The use of diamond or a diamond-like material as a polish-stop layer provides an improved ability to over-polish during the CMP process without creating additional topography, therein decreasing the amount of monitoring and control required for the CMP process. The present invention may be used to create a variety of planarized semiconductor structures, such as multi-level metal interconnect structures, semiconductor islands structures, and shallow trench isolation structures, for example. Generally, the present invention discloses a planarized semiconductor as well as a method of forming the same in a Damascene process. Such method comprises optionally depositing a dielectric or conductive layer on the surface of a semiconductor, depositing a diamond or diamond-like layer on top of such dielectric or conductive layer, depositing a hard-mask layer which serves to protect the diamond or diamond-like layer during a patterning process, forming a plurality of openings, forming a metal layer, and then planarizing the surface of the semiconductor to form a substantially planarized surface. Therein such planarized surface has a significant reduction in topography and the thermal conductivity of the finished semiconductor chip is greatly improved.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. A method of planarizing a semiconductor comprising:
    forming a first layer of a first material comprising a diamond-like carbon material on a surface of a substrate, said first layer comprising a first polish stop;
    forming a second layer of a second material on the surface of said first layer, said second layer comprising a hard-mask and a second polish stop;
    patterning said surface of said substrate thereby forming a plurality of openings therein;
    forming a third layer of a third material on the surface of said substrate thereby at least filling a set of said plurality of openings; and
    planarizing said surface of said substrate to remove at least any excess of said third layer, the planarization removing said second layer, thereby stopping at said first layer, therein said first layer allowing over-planarization of the surface of the substrate to achieve an overall substantial planarity of said surface.

2. The method according to claim 1, wherein said second layer comprises nitride, oxynitride, oxide, TEOS, glass, quartz, or combinations thereof.

3. The method according to claim 1, wherein said third layer comprises a conductive material, a dielectric material, or a semiconductor material.

4. The method according to 1, said patterning further comprising:
    patterning said second layer to form a first set of openings therein;
    patterning an exposed portion of said first layer to form a second set of openings therein; and
    patterning an exposed portion of said substrate to form a third set of openings therein.

5. The method according to claim 4, wherein the step of patterning an exposed portion of said first layer to form said second set of openings, a remaining portion of said second layer protects an underlying portion of said first layer.

6. The method according to claim 4, said third layer at least filling said third set of openings.

7. The method according to claim 1, said planarizing process comprising a chemical-mechanical polishing.

8. A method of planarizing an interconnect semiconductor structure in a Damascene process comprising:
    forming an insulator layer over a surface of a substrate, thereby creating an insulator substrate;
    forming a diamond-like carbon layer on a surface of said insulator substrate, said diamond-like carbon layer comprises a first polish-stop;
    forming a hard-mask layer on a surface of said diamond-like carbon layer, said hard-mask layer comprises a second polish-stop;
    performing a first patterning step, thereby patterning said hard-mask layer to expose a portion of said diamond-like carbon layer;

performing a second patterning step, thereby patterning said diamond-like carbon layer to expose a portion of said insulator substrate;

performing a third patterning step, thereby patterning said exposed portion of the insulator substrate to form an interconnect void on said insulator substrate, thereby forming an interconnect structure of said insulator substrate;

forming a conductive layer over a surface of said insulator substrate thereby at least filling said interconnect void; and planarizing the surface of said insulator substrate to remove at least any excess of said conductive layer, the planarization at least stopping at said second polish-stop hard-mask layer to achieve an overall substantial planarity.

9. The method according to claim 8, wherein said diamond-like carbon layer is deposited by CVD.

10. The method according to claim 8, wherein said diamond-like carbon layer preferably comprises a CVD diamond layer deposited to a thickness of about 5 nm to about 1000 nm.

11. The method according to claim 8, wherein said hard-mask layer comprises nitride, oxide, or oxynitride deposited to a thickness of about 10 nm to about 1000 nm.

12. The method according to claim 8, said first patterning step comprising patterning the hard-mask layer by depositing and developing a photo-resist material, thereafter removing a portion of said hard-mask layer in a first etch using a first plasma, wherein said first plasma removes only the exposed portion of said hard-mask layer, thereby stopping at said diamond-like carbon layer and exposing said portion thereof.

13. The method according to claim 12, said second patterning step comprising patterning said diamond-like carbon layer by a second etch using a second plasma, wherein said second etch further removes any remaining patterning material from said first patterning, thereby exposing the portion of said insulator substrate.

14. The method according to claim 13, wherein said second patterning said hard-mask layer protects said diamond-like carbon layer from the second plasma.

15. The method according to claim 13, said third patterning step comprising patterning said exposed portion of the insulator substrate using a third plasma, thereby forming an interconnect void of said insulator material.

16. The method according to claim 8, wherein said interconnect void is formed to a depth of about 100 nm to about 1000 nm.

17. The method according to claim 8, further comprising the step of forming a liner layer comprising a conductive material over the surface of the insulator substrate after formation of said interconnect void and before forming said conductive layer.

18. The method according to claim 17, further comprising removing said liner material from the surface of the insulator substrate during said planarizing step.

19. The method according to claim 8, wherein said conductive layer comprises doped polysilicon, tungsten, aluminum, or copper.

20. The method according to claim 8, further comprising in the planarizing step removing said second layer, thereby stopping at said first layer, therein said first layer allowing over-planarization of the surface of the substrate to achieve a substantial planarity of said surface.

21. A method of planarizing a semiconductor isolation structure comprising:

forming a first dielectric layer on a surface of a semiconductor substrate;

forming a diamond-like carbon layer on a surface of said first dielectric layer, said diamond-like carbon layer comprising a first polish-stop;

forming a hard-mask layer on a surface of said diamond-like carbon layer, said hard-mask layer comprising a second polish-stop;

performing a first patterning step, said first patterning comprising patterning said hard-mask layer to expose a portion of said diamond-like carbon layer;

performing a second patterning step, said second patterning comprising patterning said diamond-like carbon layer to expose a portion of the semiconductor substrate;

performing a third patterning step, said third patterning comprising patterning said exposed portion of the semiconductor substrate to form a shallow trench area on said semiconductor substrate, thereby forming an isolation structure of said semiconductor substrate;

forming a second dielectric layer over a surface of said semiconductor substrate thereby at least filling said opening; and planarizing the surface of said semiconductor substrate to remove at least any excess of said second dielectric layer, the planarization at least stopping at said second polish-stop hard-mask layer to achieve an overall substantial planarity.

22. The method according to claim 21, wherein said first dielectric layer comprises thermal oxide formed to a depth ranging from about 10 nm to about 100 nm.

23. The method according to claim 21, wherein said hard-mask layer protects said diamond-like carbon layer during said third patterning step.

24. The method according to claim 21, further comprising in the planarizing step removing said second layer, thereby stopping at said first layer, therein said first layer allowing over-planarization of the surface of the substrate to achieve a substantial planarity of said surface.

25. A method of planarizing a semiconductor island structure comprising:

forming a dielectric layer on the surface of a semiconductor substrate, wherein said semiconductor substrate comprising a semiconductor material;

forming a diamond-like carbon layer on a surface of a substrate, said diamond-like carbon layer comprising a first polish-stop;

forming a hard-mask layer on a surface of said diamond-like carbon layer, said hard-mask layer comprising a second polish-stop;

performing a first patterning step, said first patterning comprising patterning said hard-mask layer to expose a portion of said diamond-like carbon layer;

performing a second patterning step, said second patterning comprising patterning said diamond-like carbon layer to expose a portion of said dielectric layer;

performing a third patterning step, said third patterning comprising patterning said exposed portion of said dielectric layer to expose a portion of said semiconductor, thereby forming a void structure;

growing said semiconductor material thereby filling said void structure; and planarizing the surface of said substrate to remove at least any excess of said semiconductor material layer, the planarization at least stopping at said second polish-stop hard-mask layer to achieve an overall substantial planarity.

26. The method according to claim 25, wherein said hard-mask layer protects said diamond-like carbon layer during said third patterning step.

27. The method according to claim 25, wherein said void structure is formed by a selective epitaxial growth process using said semiconductor material as a seed.

28. The-method according to claim 25, wherein said island structure fills said void with a single crystalline structure.

29. The method according to claim 25, further comprising in the planarizing step removing said second layer, thereby stopping at said first layer, therein said first layer allowing over-planarization of the surface of the substrate to achieve a substantial planarity of said surface.

* * * * *